FEEDBACK STABILIZED DIRECT COUPLED AMPLIFIER

Filed Aug. 9, 1962

INVENTOR.
David B. Hallock

BY Moody and Kintzinger
Attorneys

United States Patent Office 3,210,678
Patented Oct. 5, 1965

3,210,678
FEEDBACK STABILIZED DIRECT COUPLED AMPLIFIER

David B. Hallock, Marion, Iowa, assignor to Collins Radio Company, Cedar Rapids, Iowa, a corporation of Iowa Filed Aug. 9, 1962, Ser. No. 215,871
4 Claims. (Cl. 330—19)

Figure 1:
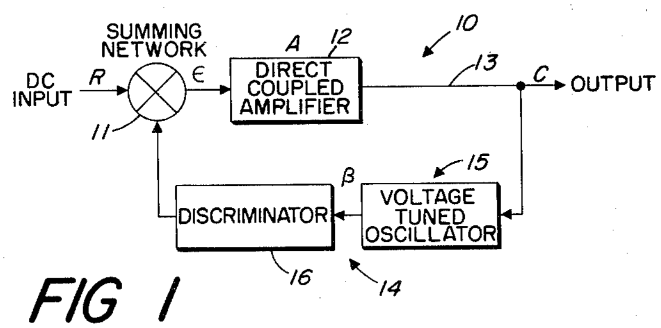

This invention relates in general to direct coupled amplifiers, and in particular to a direct coupled amplifier having a voltage controlled oscillator-discriminator feedback circuit for opposing amplifier drift.

Many amplifying systems have in the past, and are presently, utilizing direct coupling between two or more amplification stages. Such amplifiers, particularly those utilizing solid state amplifying stages, may achieve maximum economy with few parts required in direct coupling between stages. However, the number of stages that can be directly coupled is limited by the range of biasing voltages available, and also by the effect of temperature variation on bias current in various stages being amplified by all succeeding stages. Resulting severe temperature instability has been compensated for by techniques such as obtained with chopper stabilizing means, either mechanical or solid state. Various techniques have also been used directly in amplifiers for counteracting the effect of temperature variation. As a general rule these temperature change compensating techniques have been unduly complex and expensive, or not entirely satisfactory in use for preventing amplifier drift.

It is, therefore, a principal object of this invention to provide an improved output signal feedback loop for stabilizing a direct coupled amplifier from drift.

Another object is to provide for stabilizing a multistage direct coupled amplifier from amplifier drift with a voltage controlled oscillator and a FM type discriminator in a feedback loop.

A further object is to provide means for amplifier temperature compensation in a feedback loop of a direct coupled multistage amplifier.

A further object is for gain of a direct coupled amplifier to be almost completely determined in substantially all cases by the characteristics of a feedback loop.

Features of this invention useful in accomplishing the above objects, in amplifiers utilizing a plurality of direct coupled solid state stages, such as transistors, is stabilization from amplifier drift by a signal feedback loop including a voltage tuned oscillator and a FM type discriminator. Drift in the direct coupled amplifier, as reflected in the output voltage, causes a change in oscillator frequency. This frequency change is detected by the discriminator for obtaining a corresponding correction voltage so applied, in turn to a summing network, or mixer, in the amplifier input line as to oppose amplifier drift. The gain of the oscillator-discriminator transfer function is purposely made high so that the drift of the direct coupled amplifier becomes substantially that due to the oscillator-discriminator signal feedback circuit alone. Temperature variation induced drift in the oscillator-discriminator feedback loop, and of the amplifier, may be effectively compensated for by providing negative temperature coefficient capacitive means in the oscillator and/or the discriminator.

Specific embodiments representing what are presently regarded as the best modes of carrying out the invention are illustrated in the accompanying drawing.

Figure 2:
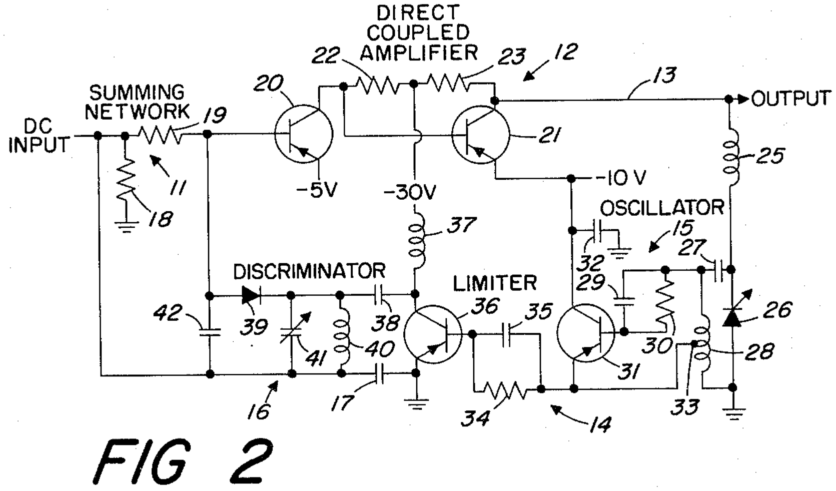
Figure 3:
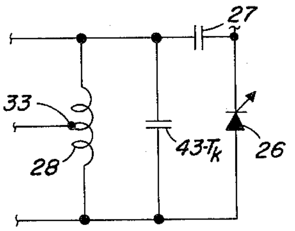

In the drawing:

FIGURE 1 represents a direct coupled amplifier with a signal feedback loop having a voltage tuned oscillator and an FM type discriminator;

FIGURE 2, a detailed circuit diagram of a direct coupled amplifier along with the oscillator and discriminator in a feedback loop; and FIGURE 3, a fragmentary view illustrating addition of a negative temperature coefficient capacitor to a portion of the oscillator circuitry.

Referring to the drawing:

The direct coupled amplifier system 10 of FIGURE 1 is shown to have an input supplied to a summing network 11. The output of summing network 11 is applied directly as an input to the first stage of direct coupled amplifier 12. The output of the last stage of direct coupled amplifier 12 is applied through output line means 13 to following equipment. A feedback loop 14 is connected to the line means 13 and responds to the direct current voltage output signal of direct coupled amplifier 12 for applying a feedback voltage signal to summing network 11. The feedback loop 14 is actually an A.C. loop in that it includes a voltage tuned oscillator 15 and a discriminator 16.

In order that direct coupled amplifiers, including an A.C. feedback loop, such as shown in FIGURE 1, may be more thoroughly understood, please refer to the following analysis. For this analysis label the input signal "R," the output of summing network 11 "$\epsilon$," the gain through the stages of the direct coupled amplifier 12 "A," the output applied through line 13 "C," and the transfer function through the feedback loop 14 "$\beta$."

It follows that:

$$C=\epsilon A;\ \epsilon=R+\epsilon A\beta;\text{ and }R=\epsilon-\epsilon A\beta$$

and the gain $$\frac{C}{R}=\frac{\epsilon A}{\epsilon-\epsilon A\beta}=\frac{A}{1-A\beta}$$

and when dividing by A then $$\frac{C}{R}=\frac{A}{\frac{1}{A}-\beta}$$

and if A is sufficiently large, that $C/R$ is substantially equal to $-1/\beta$.

Hence, it follows that with increasingly large values of gain A through the stages of the direct coupled amplifier 12 that the gain $C/R$ of the amplifying system 10 approaches and becomes substantially, just $-1/\beta$. In other words, with large values of A and 1/A a relatively low value, the gain of the amplifying system is substantially independent of the gain characteristics through the amplifying tsages of the direct coupled amplifier. Gain changes, or drift, in amplifier 12 are reduced by feedback. With this system it is important that the feedback loop 14 be very stable, since the characteristics of the amplifying system 10 are, practically speaking, substantially entirely dependent upon the stability of the feedback path. Hence, temperature compensation of the voltage controlled oscillator 15 and/or of discriminator 16 can serve as the means for quite adequate stabilization of not only the feedback loop 14 but also of the amplifying system 10 as a whole.

A direct coupled amplifier, indicated by block diagram in FIGURE 1, is shown in a detailed circuit in FIGURE 2. Signal input means is connected to summing network 11 and also through capacitor 17, acting as a radio frequency bypass, to ground. The summing network includes a resistor 18 connected between the signal input means and ground and a resistor 19 that is connected in series with the signal input means and the base of transistor 20. Transistor 20 is the first stage of the direct coupled amplifier 12. The emitter of transistor 20 is connected to a —5 volt supply. The collector of transistor 20 is connected directly to the base of second stage transistor 21, which, in the embodiment shown, also functions as the output stage. The collector is also connected through resistor 22 to a —30 volt supply. This —30 volt supply is also connected through resistor 23 for applying a voltage potential to the collector of the second stage transistor 21. The emitter of the second stage transistor is connected to a third voltage source, a —10 volt source in the embodiment shown. Output line means 13 is provided from the collector of the second stage transistor 21 for following equipment.

Voltage drift and slow voltage variations in the output signal carried by line 13 are sensed through RF choke 25 by voltage controlled oscillator 15. A voltage variable silicon capacitor (Varicap) 26 is provided between RF choke 25 and ground for adjustment of the operating frequency range of the oscillator. The junction of RF choke coil 25 and Varicap 26 is connected through capacitor 27 to coil 28, connected at its other end to ground, and through a paralled capacitor 29 and resistor 30 combination to the base of transistor 31 in oscillator 15.

The collector of transistor 31 is connected to the —10 volt supply and also through capacitor 32 to ground. The emitter of transistor 31 and a tap 33 of coil 28 are connected together and are connected as the output of oscillator 15 through a parallel resistor 34 and capacitor 35 combination to provide an input to the base of the limiter transistor 36. The emitter of transistor 36 is connected to ground while the collector of transistor 36 is connected through RF choke coil 37 to the —30 volt supply.

The junction between the collector of transistor 36 and choke coil 37, as the limiter output, is connected, as an input to discriminator 16, through capacitor 38 to the cathode of solid state diode 39. The coil 40 and adjustable capacitor 41 are connected in parallel from, the connection between capacitor 38 and diode 39, to, line means connected to the amplifier signal input means and through capacitor 17 to ground. The anode of diode 39 is connected through capacitor 42 to the line means connected to the amplifier input signal means and through capacitor 17 to ground. The anode of diode 39 is also connected to the junction between resistor 19 and the base of transistor 20 as a feedback connection to the summing network 11 and the first stage of direct coupled amplifier 12. Temperature variation caused amplifier drift and variation in the feedback loop may be compensated for by use of a negative temperature coefficient capacitor as capacitor 42 in discriminator 16 and/or by insertion of a negative temperature coefficient capacitor 43 in oscillator 15 in parallel with coil 28 as shown in FIGURE 3.

The practical embodiment illustrated by FIGURE 2 shows a direct coupled amplifier having only two stages which, however, could have a plurality of stages more than two. The Varicap 26, a standard item, readily available, is used for tuning the oscillator 15 and the associated circuit. The output of the oscillator 15 is applied through limiter transistor 36 and drives an FM type slope discriminator 16. Many forms of frequency discriminators may be used in place of the specific slope discriminator 16 shown. For that matter, other voltage tuned oscillators could be used in place of the oscillator 15 shown. In any event, whichever oscillator and discriminator combination is used, the resultant output of the slope discriminator is added to the input signal and applied to the first stage of the direct coupled amplifier. The slope discriminator used must be tuned for producing sufficient bias for operation of the amplifying stages at their proper operating points.

It should be noted that direct coupled amplifiers may be used for A.C. signals within the bandwidth limitations of the transistor amplifier and the FM feedback loop. When used in this manner the A.C. signal could be passed as a varying D.C. signal and amplified through the direct coupled amplifying system. Regardless of the way the amplifier is used, changes in signal voltages can be extremely low in frequency and still give an amplified output. Since direct coupled amplifiers are generally used for handling audio and subaudio frequencies such response at low frequency is a major advantage of the circuit.

Whereas this invention is here illustrated and described with respect to several embodiments thereof, it should be realized that various changes may be made without departing from the essential contributions to the art made by the teachings hereof.

I claim:

1. A stabilized direct coupled amplifier circuit comprising: a summing network having at least two inputs one of which is connected to receive a D.C. input signal; a direct coupled amplifier; a feedback loop including a voltage tuned oscillator connected to the output of said direct coupled amplifier and common only to the feedback loop and subject to frequency shift with drift of the output of said amplifier; said feedback loop including high A.C. impedance means connected between said output connection and said voltage tuned oscillator, and a discriminator connected for receiving the frequency output of said voltage tuned oscillator; and said discriminator being connected for feeding the discriminator output to another input of said summing network and the first stage of said amplifier.

2. The amplifier of claim 1 wherein temperature change induced variation compensating means is provided in said feedback loop.

3. The direct coupled amplifier of claim 1 wherein said summing network receives the input signal and combines the input signal with the feedback from said discriminator; with said input signal labeled "R," the output of the summing network labeled "$\epsilon$," gain through the direct coupled stages of the amplifier labeled "A," the output of the amplifier labeled "C," and the transfer function through the feedback loop labeled "$\beta$," that the gain $C/R$ of the amplifier system is equal to $$\frac{1}{\frac{1}{A}-\beta}$$

4. The direct coupled amplifier of claim 3 wherein, the gain "A" through the direct coupled stages of the amplifier is sufficiently large and the term $1/A$ of sufficiently low value that, the gain of the amplifying system is substantially determined by the transfer characteristics of the feedback loop and is substantially equal to $-1/\beta$.

References Cited by the Examiner

UNITED STATES PATENTS

| | | | |
|---|---|---|---|
| 2,240,428 | 4/41 | Travis | 331—36 X |
| 3,050,693 | 8/62 | Sinninger | 331—36 X |
| 3,087,121 | 4/63 | Bell | 331—11 |

OTHER REFERENCES

"Active Networks," text, Rideout, Prentice-Hall, Inc., Englewood Cliffs, N.J., pages 170–172.

Radiotron Designer's Handbook, Fourth Edition 1952, RCA.

ROY LAKE, *Primary Examiner.*

NATHAN KAUFMAN, *Examiner.*